United States Patent
Kirby et al.

(10) Patent No.: US 10,312,141 B2
(45) Date of Patent: Jun. 4, 2019

(54) PRECLEAN METHODOLOGY FOR SUPERCONDUCTOR INTERCONNECT FABRICATION

(71) Applicants: Christopher F. Kirby, Gambrills, MD (US); Sandro J. Di Giacomo, Ellicott City, MD (US); Michael Rennie, Mechanicsville, VA (US)

(72) Inventors: Christopher F. Kirby, Gambrills, MD (US); Sandro J. Di Giacomo, Ellicott City, MD (US); Michael Rennie, Mechanicsville, VA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 232 days.

(21) Appl. No.: 15/238,394

(22) Filed: Aug. 16, 2016

(65) Prior Publication Data

US 2018/0053689 A1    Feb. 22, 2018

(51) Int. Cl.
H01L 21/768 (2006.01)
H01L 23/532 (2006.01)
H01L 21/02 (2006.01)

(52) U.S. Cl.
CPC .. *H01L 21/76891* (2013.01); *H01L 21/02074* (2013.01); *H01L 21/76883* (2013.01); *H01L 23/53285* (2013.01)

(58) Field of Classification Search
CPC ......... H01L 21/76891; H01L 23/53285; H01L 39/249
See application file for complete search history.

(56) References Cited

U.S. PATENT DOCUMENTS

| | | | |
|---|---|---|---|
| 6,482,656 B1 | 11/2002 | Lopatin | |
| 8,241,701 B2 | 8/2012 | Dordi et al. | |
| 9,653,398 B1* | 5/2017 | Kelliher | H01L 23/53285 |
| 2007/0184656 A1 | 8/2007 | Sherman et al. | |
| 2015/0179918 A1 | 6/2015 | Greer et al. | |
| 2015/0214093 A1* | 7/2015 | Dordi | H01L 21/0206 204/192.35 |

OTHER PUBLICATIONS

Katoh, Y. et al., "NB-OXIDE-PB Tunnel Junctions Fabricated Using CF4 Cleaning Process. (III) Preparation of Planar DC Squid", Japanese Journal of Applied Physics, JP,vol. 26, No. 10, Oct. 1, 1987 (Oct. 1, 1987), pp. 1657-1662. p. 1658, left hand column, paragraph 3.

International Search Report corresponding to International Application No. PCT/US2017/043673, dated May 7, 2018.

* cited by examiner

*Primary Examiner* — Errol V Fernandes
(74) *Attorney, Agent, or Firm* — Tarolli, Sundheim, Covell & Tummino LLP

(57) ABSTRACT

A method is provided of forming a superconductor device interconnect structure. The method includes forming a first dielectric layer overlying a substrate, and forming a superconducting interconnect element in a first dielectric layer, such that the superconducting interconnect element has a top surface aligned with a top surface of the first dielectric layer to form a first interconnect layer. The method also includes performing a plasma clean on a top surface of the first interconnect layer, and depositing a second dielectric layer over the first dielectric layer.

16 Claims, 6 Drawing Sheets

PRECLEAN METHODOLOGY FOR SUPERCONDUCTOR INTERCONNECT FABRICATION

GOVERNMENT INTEREST

The invention was made under US Contract Number 30059278. Therefore, the US Government has rights to the invention as specified in that contract.

TECHNICAL FIELD

The present invention relates generally to superconductors, and more particularly to a preclean methodology for superconductor interconnect fabrication.

BACKGROUND

Superconducting circuits are one of the leading technologies proposed for quantum computing and cryptography applications that are expected to provide significant enhancements to national security applications where communication signal integrity or computing power are needed. They are operated at temperatures<100 kelvin. Efforts on fabrication of superconducting devices have mostly been confined to university or government research labs, with little published on the mass producing of superconducting devices. Therefore, many of the methods used to fabricate superconducting devices in these laboratories utilize processes or equipment incapable of rapid, consistent fabrication. Recently there has been a movement to mass producing superconducting circuits utilizing similar techniques as those utilized in conventional semiconductor processes.

One well-known semiconductor process is the formation of contacts and conductive lines in a multi-level interconnect stack to couple devices to one another over different layers of an integrated circuit. One such fabrication process for formation of conductive contacts and lines is known as a dual damascene process. This technique has recently been attempted in the formation of superconducting circuits. During the fabrication of dual damascene superconducting circuits, via/trench structures are patterned, etched, filled with metal (e.g., niobium, tantalum, aluminum), then polished back using a chemical mechanical polishing (CMP) process. The next level dielectric is then deposited, and the sequence begins again, building up a multi-level interconnect stack. The CMP process and any exposure to oxygen prior to deposition of the next dielectric layer can result in oxidization of the conductive contacts and lines, which degrades performance. One technique utilizes an argon (Ar) sputter etch process to remove unwanted oxidized layers from substrate surface. However, the Ar sputter process can be unacceptable in this application because it produces a redeposited layer of non-volatile superconducting compounds on the substrate surface.

SUMMARY

In one example, a method is provided of forming a superconductor device interconnect structure. The method comprises forming a first dielectric layer overlying a substrate, and forming a superconducting interconnect element in a first dielectric layer, such that the superconducting interconnect element has a top surface aligned with a top surface of the first dielectric layer to form a first interconnect layer. The method also comprises performing a cleaning process on a top surface of the first interconnect layer, and depositing a second dielectric layer over the first dielectric layer.

In another example, another method of forming a superconductor device interconnect structure is provided. This method comprises disposing an interconnect layer in a preclean chamber with the interconnect layer having a superconducting contact or conductive line having a top surface aligned with a top surface of a first dielectric layer, wherein a top surface of the superconducting contact or conductive line has an oxidized layer. A tetrafluoromethane ($CF_4$) gas is introduced into the preclean chamber, and etch conditions set to induce a plasma clean etch with the tetrafluoromethane ($CF_4$) gas for a predetermined time period to remove the oxidized layer from the superconducting contact or conductive line. The method further comprises disposing the interconnect layer in a deposition chamber, and depositing a second dielectric over the interconnect layer.

In accordance with yet another example, a further method of forming a superconductor device interconnect structure is provided. The method comprises depositing niobium in openings in a first dielectric layer overlying a substrate to form one or more superconducting interconnect elements in the first dielectric layer, and performing a chemical mechanical polish (CMP) to align a top surface of the one or more superconducting interconnect elements with a top surface of the first dielectric layer, wherein the CMP causes oxidization on a top surface of the one or more superconducting interconnect elements. The method further comprises performing a plasma clean on the oxidation by introducing tetrafluoromethane ($CF_4$) gas into an environment of the first dielectric layer and setting etch conditions to induce a plasma clean etch with the tetrafluoromethane ($CF_4$) gas; and depositing a second dielectric over the first interconnect layer.

DETAILED DESCRIPTION

The present invention is directed to a superconductor interconnect structure and a method for forming the same. The method incorporates a preclean process to remove oxide layers from superconducting metal interconnect elements (e.g., conductive lines, contacts) prior to encapsulation of the metal interconnect elements in the next level of dielectric. The oxides can be as a result of a chemical mechanical process (CMP), and/or as a result of the exposure of the superconductor interconnect structure to oxygen outside of a vacuum environment. In one example, the method integrates the plasma clean process into a dual damascene process for scaling into a high density multilevel interconnect submicron technology. The method can employ a tetrafluoromethane ($CF_4$) based plasma clean etch process prior to dielectric deposition of a next layer in the dual damascene process to assure a smooth clean surface of the metal interconnect elements on the underlying layer.

The methodology can flow oxygen ($O_2$) into a chamber along with tetrafluoromethane ($CF_4$) to increase the number of fluorine radicals and increase the etch rate. The flow of the oxygen can be stopped so that only the tetrafluoromethane ($CF_4$) will slowly flow into the chamber. The slower CF4-only etch is to finish the etch without $O_2$ present, so that any unintentional oxidation caused by the presence of $O_2$ will be substantially removed when the etch stops. The decomposed tetrafluoromethane ($CF_4$) will combine with the metal-oxide to form a gas that will evaporate off the surface of the superconducting interconnect element and as a result leave a smooth surface on the top surface of the superconducting interconnect element prior to dielectric deposition of the next layer.

Figure 1:
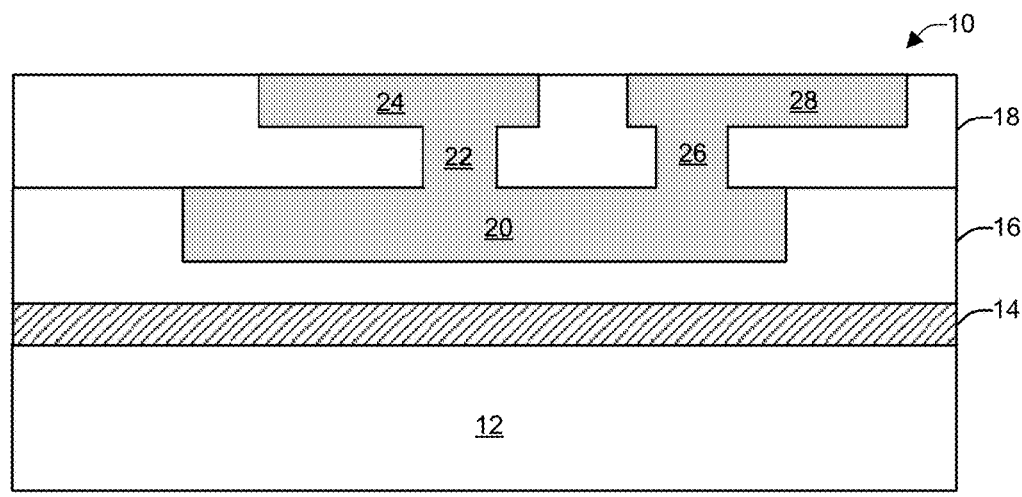
FIG. 1 illustrates cross-sectional view of a superconducting device interconnect structure.

FIG. 1 illustrates cross-sectional view of a superconducting interconnect structure 10. The superconducting interconnect structure 10 includes an active layer 14 overlying a substrate 12. The substrate 12 can be formed of silicon, glass or other substrate material. The active layer 14 can be a ground layer or a device layer. A first dielectric layer 16 overlies the active layer 14, and a second dielectric layer 18 overlies the first dielectric layer 16. Both the first and the second dielectric layers 16 and 18 can be formed of a low temperature dielectric material that can be employed in low temperatures (e.g., less than or equal to 160 degrees Celsius) typically utilized in the formation of superconducting devices. A first conductive line 20 is embedded in the first dielectric layer 16. A first conductive contact 22 extends from the first conductive line 20 at a first end to a second conductive line 24 in the second dielectric layer 18, and a second conductive contact 26 extends from the first conductive line 20 at a second end to a third conductive line 28 in the second dielectric layer 18. Each of the contacts and conductive lines are formed of a superconducting material, such as niobium. A cleaning process as described herein is performed prior to deposition of the next dielectric layer. A cleaning process can also be performed prior to deposition of layer 18.

Turning now to FIGS. 2-10, fabrication is discussed in connection with formation of interconnects in the superconducting device of FIG. 1. It is to be appreciated that the present example is discussed with respect to a process flow that starts with the formation of either a single or dual damascene layer of superconducting metal in an insulating dielectric. The present example will be illustrated with respect to a single damascene trench etched into a dielectric thin film to form a bottom conductive line followed by a dual damascene process to form top conductive lines.

Figure 2:
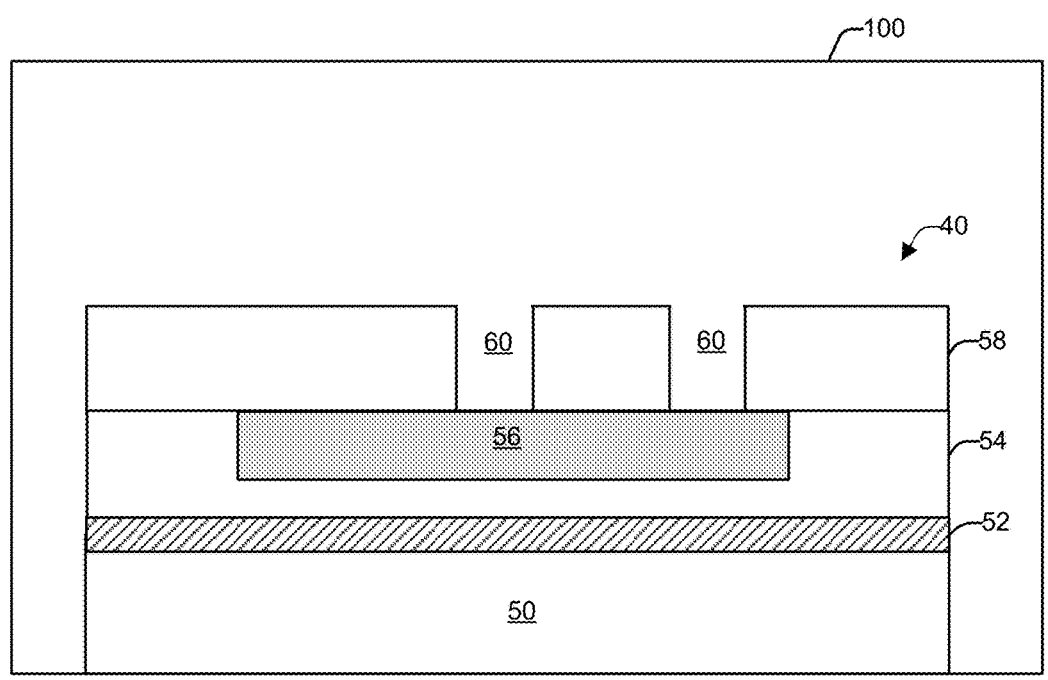
FIG. 2 illustrates a schematic cross-sectional view of an example of a superconductor structure in its early stages of fabrication.

FIG. 2 illustrates a cross-sectional view of a superconductor structure 40 in its early stages of fabrication. The superconductor structure resides in an etch chamber for forming vias and trenches in one or more dielectric layers. The superconductor structure 40 includes an active layer 52, such as a ground layer or device layer, that overlays an underlying substrate 50. The underlying substrate 50 can be, for example, a silicon or glass wafer that provides mechanical support for the active layer 52 and subsequent overlying layers. A first dielectric layer 54 is formed over the active layer 52. Any suitable technique for forming the first dielectric layer 54 may be employed such as Low Pressure Chemical Vapor Deposition (LPCVD), Plasma Enhanced Chemical Vapor Deposition (PECVD), High Density Plasma Chemical Vapor Deposition (HDPCVD), sputtering or spin-on techniques to a thickness suitable for providing an interconnect layer. Alternatively, the first dielectric layer 54 can be formed directly on the substrate 50 in examples in which the active layer 52 is omitted. A conductive line 56 resides within the first dielectric layer 54 and has a top surface that is flush with a top surface of the first dielectric layer 54. The conductive line 56 can be formed in a single damascene process, and goes through a cleaning process prior to deposition of the next dielectric layer.

Figure 3:
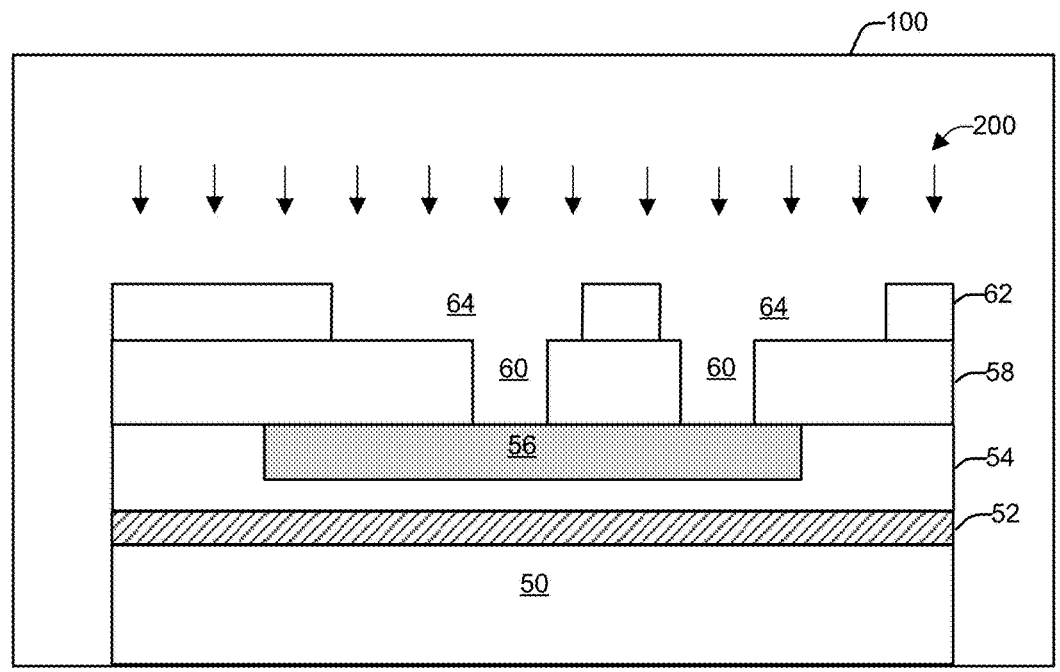
FIG. 3 illustrates a schematic cross-sectional view of the structure of FIG. 2 after a photoresist material layer has been deposited and patterned, and while undergoing an etch process in an etch chamber.
Figure 4:
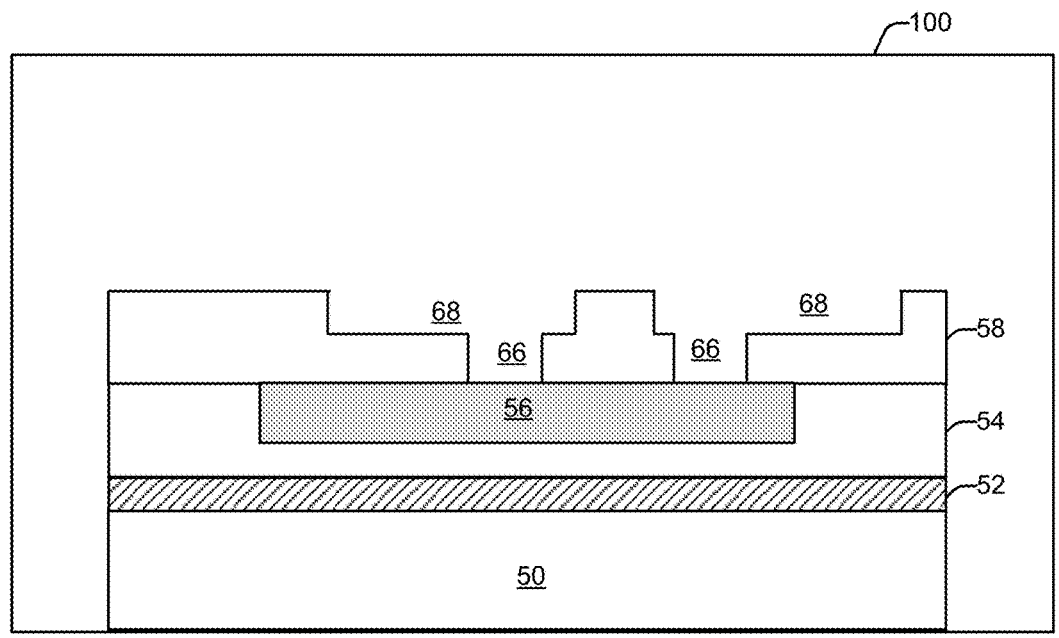
FIG. 4 illustrates a schematic cross-sectional view of the structure of FIG. 3 after the etch process and after the photoresist material layer has been stripped.

A second dielectric layer 58 overlies the first dielectric layer 54 and includes a pair of vias 60 that extend from a top surface of the second dielectric layer 58 to a top surface of the conductive line 56 that resides in the first dielectric layer 54. The pair of vias 60 were formed in a first portion of a dual damascene process. FIG. 3 illustrates a second portion of the dual damascene process. As illustrated in FIG. 3, a photoresist material layer 62 has been applied to cover the structure and patterned and developed to expose trench openings 64 in the photoresist material layer 62 in accordance with a trench pattern. The photoresist material layer 62 can have a thickness that varies in correspondence with the wavelength of radiation used to pattern the photoresist material layer 62. The photoresist material layer 62 may be formed over the second dielectric layer 58 via spin-coating or spin casting deposition techniques, selectively irradiated (e.g., via deep ultraviolet (DUV) irradiation) and developed to form the trench openings 64.

FIG. 3 also illustrates performing of an etch 200 (e.g., anisotropic reactive ion etching (RIE)) on the second dielectric layer 58 to form extended trench openings 68 (FIG. 4) in the second dielectric layer 58 based on the trench pattern in the photoresist material layer 62. The etch step 200 can be a dry etch and employ an etchant which selectively etches the underlying second dielectric layer 58 at a faster rate than the underlying conductive line 56 and the overlying photoresist material layer 62. For example, the second dielectric layer 58 may be anisotropically etched with a plasma gas(es), herein carbon tetrafluoride ($CF_4$) containing fluorine ions, in a commercially available etcher, such as a parallel plate RIE apparatus or, alternatively, an electron cyclotron resonance (ECR) plasma reactor to replicate the mask pattern of the patterned of the photoresist material layer 62 to thereby create the extended trench openings 64. The photoresist material layer 62 is thereafter stripped (e.g., ashing in an $O_2$ plasma) so as to result in the structure shown in FIG. 4.

Figure 5:
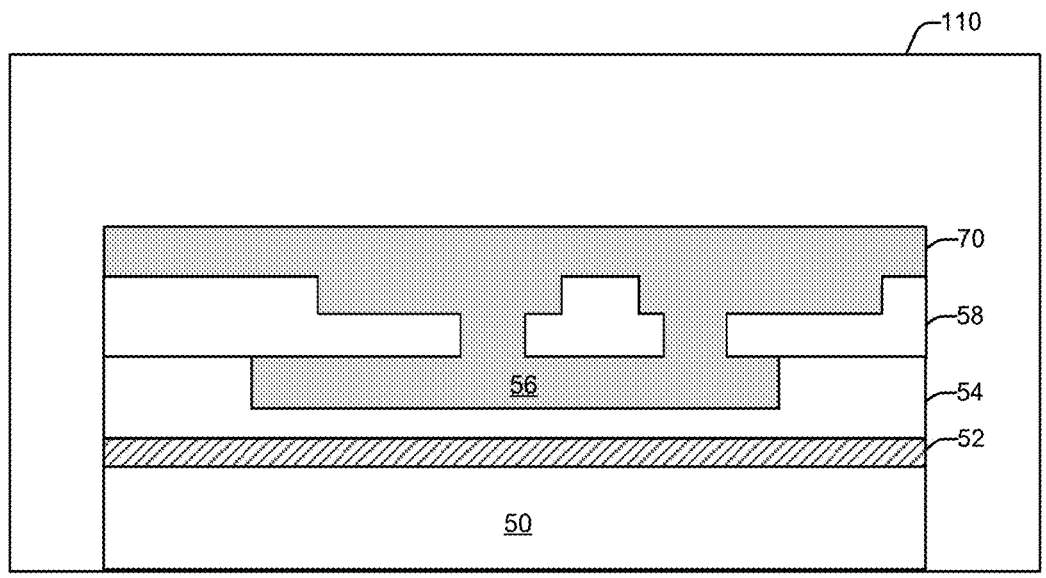
FIG. 5 illustrates a schematic cross-sectional view of the structure of FIG. 4 after a contact material fill in a material deposition chamber.
Figure 6:
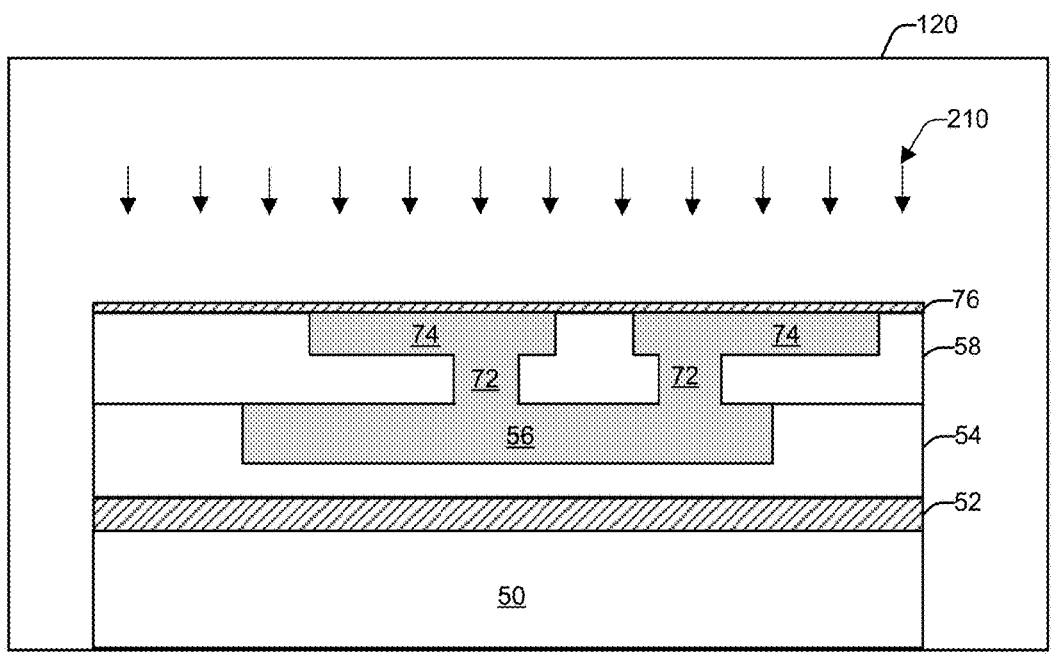
FIG. 6 illustrates a schematic cross-sectional view of the structure of FIG. 5 after undergoing a chemical mechanical polish.

Next, as illustrated in FIG. 5, the structure is placed into a material deposition chamber 110 and undergoes a contact material fill to deposit a superconducting material 70, such as niobium, into the via openings 60 and the trench openings 64 to form the resultant structure shown in FIG. 5. The contact material fill can be deposited employing a standard contact material deposition. Following deposition of the contact material fill, the superconducting material 70 is placed into a polish chamber 120 and is polished via chemical mechanical polishing (CMP) down to the surface level of the dielectric layer 58 to form conductive lines 74 and contacts 72 that form part of the metal interconnects and provide the resultant structure of FIG. 6.

However, during the CMP process, a chemical oxide may grow on the surface of the metal to a thickness of approximately 70 Å, and remain after the CMP process is complete. This oxide grows, for example, due to the presence of ammonium hydroxide and hydrogen peroxide in the CMP process. In the case where niobium is employed as the metal, a niobium oxide is formed. The presence of this niobium oxide will degrade the performance of the superconducting circuits (losses in the metal lines), so it needs be removed prior to the deposition of the next dielectric layer. The resultant structure of FIG. 6 may have an oxidized surface layer 76 on the superconducting material as a result of the CMP process.

Figure 7:
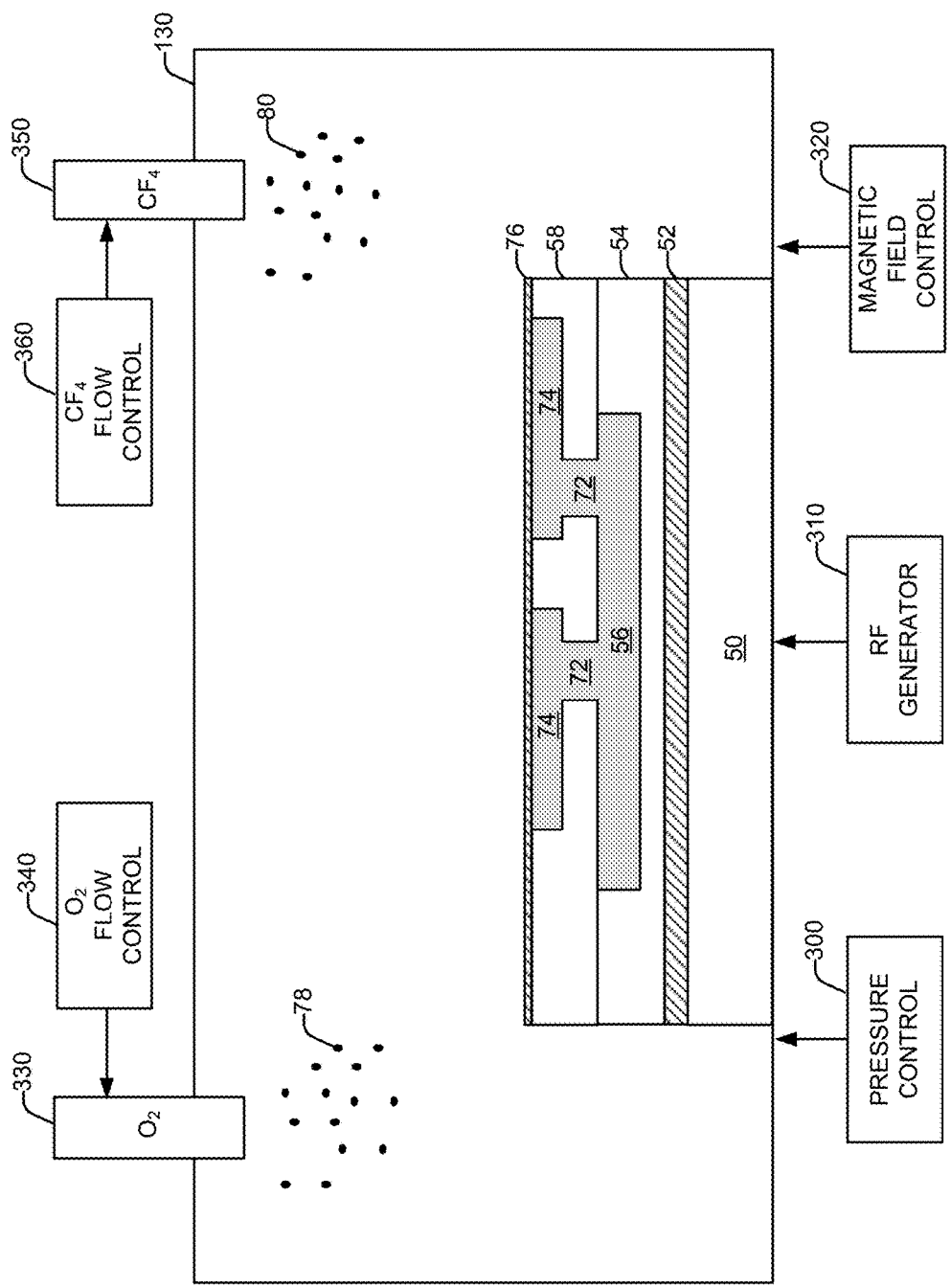
FIG. 7 illustrates a schematic cross-sectional view of the structure of FIG. 6 disposed in a preclean chamber for undergoing a preclean process.

The resultant structure is then placed into a preclean chamber 130 to undergo a precleaning process, as illustrated in FIG. 7. The resultant structure could have an oxidized surface layer on the superconducting material due to its exposure to oxygen when being removed from the CMP chamber to the precleaning chamber, or an oxidized layer in addition to the oxide layers formed from the CMP process. The purpose of the precleaning process is to remove these oxide layers from the metal interconnect surfaces prior to their encapsulation in the next level dielectric layer.

The preclean chamber 130 includes an oxygen source 330 that provides oxygen ($O_2$) 78 into the preclean chamber 130 at a flow rate based on an oxygen flow control device 340, and a tetrafluoromethane source 350 that provides tetrafluoromethane ($CF_4$) 80 into the preclean chamber 130 at a flow rate based on a tetrafluoromethane flow control device 360. The preclean chamber 130 also includes a pressure controller 300 that sets the pressure inside the chamber 130, a RF generator 310 that sets the radio wave power in the preclean chamber 130 and a magnetic field controller 320 that sets the magnetic field in the pressure chamber 130. In one example, the preclean chamber 130 is an Applied Materials MxP etch chamber attached to a P5000 mainframe, but can also be a standard Applied Materials sputter etch chamber, or any appropriately equipped parallel plate reactive ion etch (RIE) chamber.

The present example illustrates five steps in the preclean process and assumes the utilization of niobium metal conductive lines and/or contacts, but other superconducting metals, such as tantalum, could also be used. In FIG. 7, the chamber pressure is set to about 100 milliTorr (mT), and the $CF_4$ and $O_2$ gas flows are set to about 90 standard cubic centimeters per minute (sccm) and about 15 sccm, respectively, for about 20 seconds. The RF generator is then turned on to about 1 Watt (W) for about 1 second. Next the RF power is set to about 50 W, with the magnets set to about 60 Gauss (G) to provide the primary niobium oxide etch step for about 5 seconds. The methodology flow of oxygen ($O_2$) into the preclean chamber 130 along with tetrafluoromethane ($CF_4$) assures a sufficiently high number of fluorine radicals exist for an effective bulk removal of the metal-oxide layer.

Figure 8:
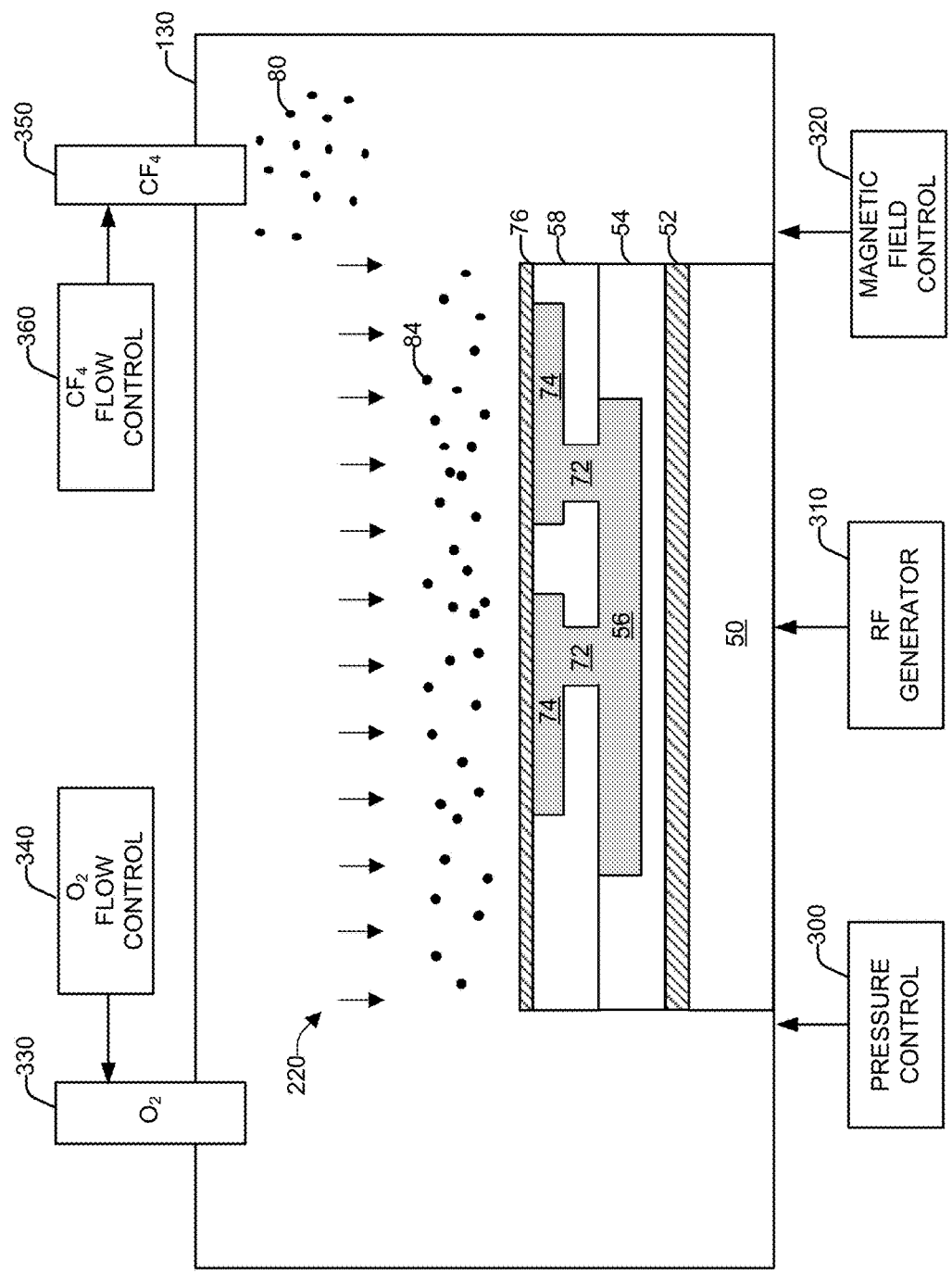
FIG. 8 illustrates a schematic cross-sectional view of the structure of FIG. 7 while undergoing a preclean etch process.

Next, referring to FIG. 8, the $O_2$ gas flow is stopped so that only the tetrafluoromethane ($CF_4$) will flow into the chamber for a $CF_4$ only etch process for about 10 seconds. The tetrafluoromethane ($CF_4$) will combine with the metal-oxide to form a gas that will evaporate off the surface of the metal interconnect essentially etching away the niobium oxide layers and as a result leave a smooth surface on the top surface of the metal interconnect prior to dielectric deposition of the next layer. The tetrafluoromethane ($CF_4$) will combine with the Niobium (Nb), to generate $NbF_5$ 84 which is a gas that will evaporate off the surface of the metal interconnect. Additionally, the plasma etch will break the niobium-oxide bond and generate $O_2$ gas which will also evaporate off the surface. Finally, all gas flows are stopped, the RF power and the magnets are turned off, and the throttle is fully open for about 5 seconds. A variation of this recipe is to omit $CF_4$ plus $O_2$ combination flow and run a single $CF_4$ etch step for a longer time period. Another variation to this process would use different gas flows, but similar flow ratios to achieve the same end result.

Figure 9:
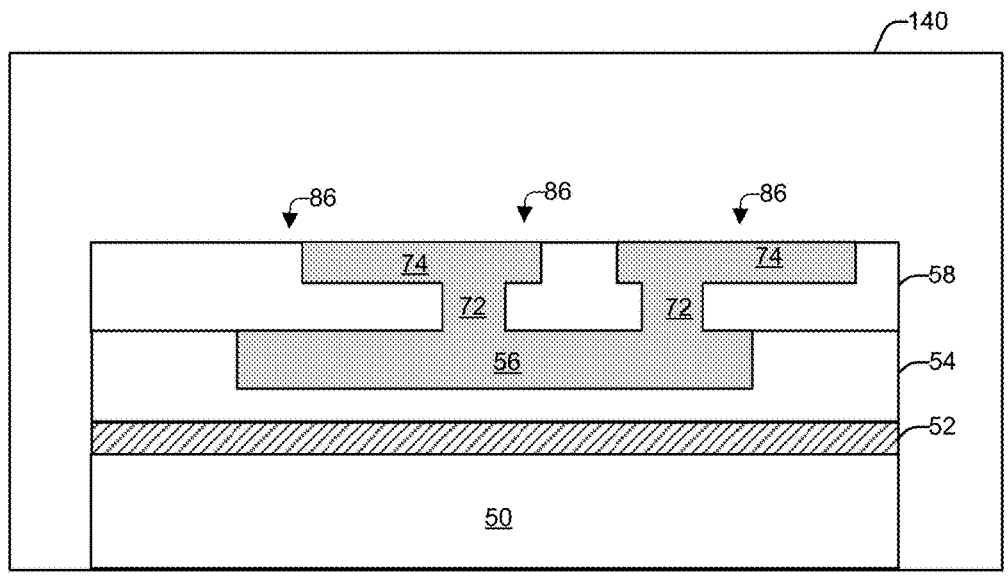
FIG. 9 illustrates a schematic cross-sectional view of the structure of FIG. 8 being disposed in a deposition chamber.
Figure 10:
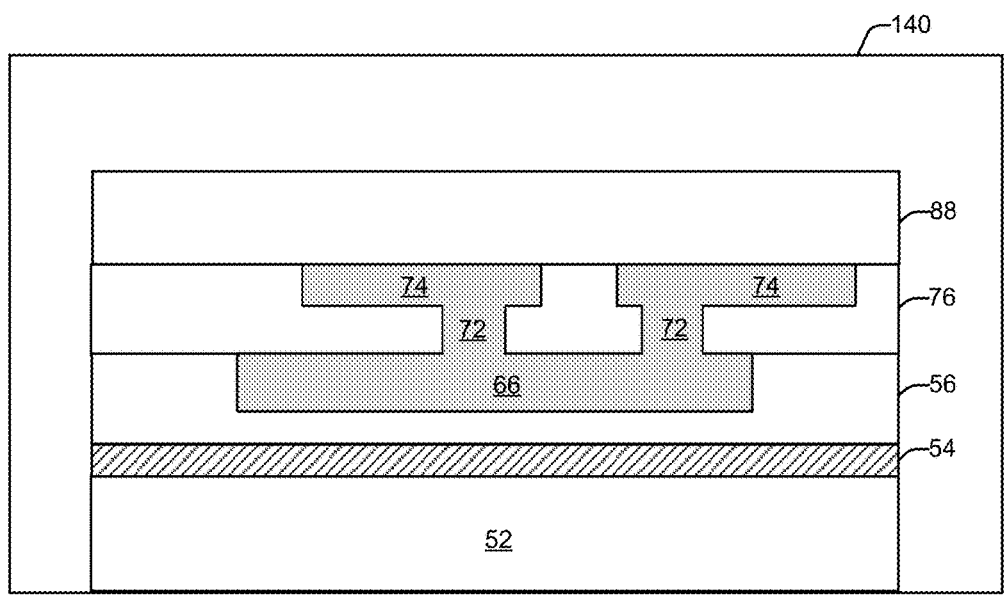
FIG. 10 illustrates a schematic cross-sectional view of the structure of FIG. 9 after undergoing deposition of a second dielectric layer.

As illustrated in FIG. 9, the superconductor structure with the cleaned top surface is then moved to a deposition chamber 140 to undergo a subsequent dielectric deposition process for forming the next interconnect layer in the superconductor structure. The resultant structure is illustrated in FIG. 10 with a subsequent dielectric layer 88 overlying the structure and encapsulating the first and second conductive lines. The subsequent dielectric layer can then be further processed for subsequent interconnect layers.

In one example, the preclean chamber and dielectric deposition chamber are mounted on the same mainframe such that the transfer between chambers occurs in vacuo, and avoids any unwanted oxidation of the metal lines between the preclean and the deposition. An alternate example is to have the two chambers on different mainframes and strictly control the delay between the end of the preclean process and the beginning of the dielectric deposition to minimize the time spent at atmosphere.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A method of forming a superconductor device interconnect structure, the method comprising:
   forming a first dielectric layer overlying a substrate;
   forming a superconducting interconnect element in a first dielectric layer, the interconnect element having a top surface aligned with a top surface of the first dielectric layer to form a first interconnect layer;
   performing a cleaning process on a top surface of the first interconnect layer, the cleaning process comprising introducing tetrafluoromethane ($CF_4$) gas into the environment of the first interconnect layer concurrently with oxygen, stopping the introduction of oxygen after a first predetermined time period and setting etch parameters in the environment to start the cleaning process for a second predetermined time period to remove any oxidation off the top surface of the superconducting contact or conductive line; and
   depositing a second dielectric over the first interconnect layer.

2. The method of claim 1, wherein the cleaning process is a tetrafluoromethane ($CF_4$) based plasma clean etch process.

3. The method of claim 2, wherein the superconducting interconnect element is formed from niobium.

4. The method of claim 2, wherein the forming a superconducting interconnect element that has a top surface aligned with the top surface of the first dielectric layer to form a first interconnect layer comprises forming openings in the first dielectric layer, performing a contact material fill to fill the formed openings, and performing a chemical mechanical polish (CMP) to align a top surface of the superconducting interconnect element with a top surface of the first dielectric layer, wherein the plasma clean removes oxidization on a top surface of the superconducting interconnect element caused by the CMP.

5. The method of claim 1, wherein at least one of the dielectric material employed in the first dielectric layer and the second dielectric layer is formed of a dielectric material that can form at a temperature of about or below 160° Celsius.

6. The method of claim 1, wherein the superconducting interconnect element is a first conductive line and further comprising forming a second conductive line and a first contact in the second dielectric layer and a third conductive line and a second contact in the second dielectric layer, the first and second contacts being coupled to different portions of the first conductive line.

7. The method of claim 1, wherein the cleaning process comprises:
placing the first interconnect layer in a preclean chamber;
setting the chamber pressure to about 100 mT (millitorr), and concurrently introducing tetrafluoromethane ($CF_4$) gas at a flow rate of about 90 standard cubic centimeters per minute (sccm), and oxygen at a flow rate of about 15 sccm for a first predetermined time period;
turning RF power in the preclean chamber to about 1 Watt (W) for a second predetermined time period;
increasing the RF power to about 50 W and setting the magnetic field in the preclean chamber to about 60 gauss (G) for a third predetermined time period;
stopping the flow of oxygen for a fourth predetermined time period; and
stopping the flow of tetrafluoromethane ($CF_4$) gas and turning off the power and magnetic field in the preclean chamber for a fifth predetermined time period.

8. The method of claim 7, wherein the first predetermined time period is about 20 seconds, the second predetermined time period is about 1 second, the third predetermined time period is about 5 seconds, the fourth predetermined time period is about 10 seconds and the fifth predetermined time period is at least five seconds.

9. A method of forming a superconductor device interconnect structure, the method comprising:
disposing a superconducting interconnect layer in a preclean chamber, the superconducting interconnect layer having a superconducting contact or conductive line having a top surface aligned with a top surface of a first dielectric layer, wherein a top surface of the superconducting contact or conductive line has an oxidized layer, wherein the superconducting material employed to form the superconducting contact or conductive line is niobium (Nb) and the oxidized layer is niobium oxide;
introducing tetrafluoromethane ($CF_4$) gas into the preclean chamber;
setting etch conditions to induce a plasma clean etch with the tetrafluoromethane ($CF_4$) gas for a predetermined time period to break the oxidized layer from the superconducting contact or conductive line to produce niobium fluoride ($NbF_5$) gas and oxygen ($O_2$) gas that evaporates off the surface of the niobium to form a clean niobium top surface;
disposing the interconnect layer in a deposition chamber; and
depositing a second dielectric over the interconnect layer.

10. The method of claim 9, further comprising introducing oxygen ($O_2$) into the preclean chamber concurrently with the introducing of the tetrafluoromethane ($CF_4$) gas for a predetermined time period to ensure a sufficiently high number of fluorine radicals exist for an effective bulk removal of the metal-oxide layer.

11. The method of claim 9, wherein the superconductor device interconnect structure is moved from the preclean chamber to the deposition chamber in vacuum to avoid any unwanted oxidation.

12. The method of claim 9, wherein the preclean chamber and the deposition chamber are mounted on different mainframes with the delay between moving from the preclean chamber to deposition chamber being controlled to minimize the time spent at atmosphere.

13. The method of claim 9, wherein the setting etch conditions comprises setting the pressure of the preclean chamber, the gas flow of the tetrafluoromethane ($CF_4$) gas, the RF power of the preclean chamber and the magnetic field of the preclean chamber for performing a plasma clean etch.

14. A method of forming a superconductor device interconnect structure, the method comprising:
depositing niobium in openings in a first dielectric layer overlying a substrate to form one or more superconducting interconnect elements in the first dielectric layer;
performing a chemical mechanical polish (CMP) to align a top surface of the one or more superconducting interconnect elements with a top surface of the first dielectric layer, wherein the CMP causes oxidization on a top surface of the one or more superconducting interconnect elements;
performing a plasma clean on the oxidation by introducing tetrafluoromethane ($CF_4$) gas into an environment of the first dielectric layer and setting etch conditions to induce a plasma clean etch with the tetrafluoromethane ($CF_4$) gas; and
depositing a second dielectric over the first interconnect layer.

15. The method of claim 14, wherein the plasma clean comprises:
placing the first interconnect layer in a preclean chamber;
setting the chamber pressure to about 100 mT (millitorr), and concurrently introducing tetrafluoromethane ($CF_4$) gas at a flow rate of about 90 standard cubic centimeters per minute (sccm), and oxygen at a flow rate of about 15 sccm for a first predetermined time period;
turning RF power in the preclean chamber to about 1 Watt (W) for a second predetermined time period;
increasing the RF power to about 50 W and setting the magnetic field in the preclean chamber to about 60 gauss (G) for a third predetermined time period;
stopping the flow of oxygen for a fourth predetermined time period; and
stopping the flow of tetrafluoromethane ($CF_4$) gas and turning off the power and magnetic field in the preclean chamber for a fifth predetermined time period.

16. A method of forming a superconductor device interconnect structure, the method comprising:

forming a first dielectric layer overlying a substrate;
forming a superconducting interconnect element in a first dielectric layer, the interconnect element having a top surface aligned with a top surface of the first dielectric layer to form a first interconnect layer comprises forming openings in the first dielectric layer;
performing a contact material fill to fill the formed openings;
performing a chemical mechanical polish (CMP) to align a top surface of the superconducting interconnect element with a top surface of the first dielectric layer;
performing a cleaning process on a top surface of the first interconnect layer, wherein the cleaning process is a tetrafluoromethane ($CF_4$) based plasma clean etch process that removes oxidation on a top surface of the superconducting interconnect element caused by the CMP; and
depositing a second dielectric over the first interconnect layer.

* * * * *